(12) United States Patent
Shachar et al.

(10) Patent No.: US 12,484,199 B2
(45) Date of Patent: Nov. 25, 2025

(54) MANAGEMENT OF HARDWARE IN ENVIRONMENTS THAT INCLUDE PARTICULATES

(71) Applicant: Dell Products L.P., Round Rock, TX (US)

(72) Inventors: Tomer Shachar, Beer-Sheva (IL); Yevgeni Gehtman, Modi'in (IL); Maxim Balin, Gan-Yavne (IL)

(73) Assignee: Dell Products L.P., Round Rock, TX (US)

( * ) Notice: Subject to any disclaimer, the term of this patent is extended or adjusted under 35 U.S.C. 154(b) by 183 days.

(21) Appl. No.: 18/488,534

(22) Filed: Oct. 17, 2023

(65) Prior Publication Data
US 2025/0126757 A1   Apr. 17, 2025

(51) Int. Cl.
*H05K 7/20* (2006.01)
*B01D 46/00* (2022.01)

(52) U.S. Cl.
CPC ..... *H05K 7/20718* (2013.01); *B01D 46/0034* (2013.01); *H05K 7/20836* (2013.01)

(58) Field of Classification Search
CPC ........... H05K 7/20718; H05K 7/20836; H05K 7/20181; B01D 46/0034
See application file for complete search history.

(56) References Cited

U.S. PATENT DOCUMENTS

| | | | |
|---|---|---|---|
| 2009/0158926 A1* | 6/2009 | Taylor ............... | B01D 46/2407 96/65 |
| 2012/0103184 A1* | 5/2012 | Jia ..................... | B03C 3/12 96/22 |
| 2020/0171414 A1* | 6/2020 | Lyon ................... | B01D 35/143 |
| 2025/0025890 A1* | 1/2025 | Bologa ................ | B03C 3/09 |

* cited by examiner

*Primary Examiner* — Jacob R Crum
(74) *Attorney, Agent, or Firm* — WOMBLE BOND DICKINSON (US) LLP

(57) ABSTRACT

Devices, systems, and methods for managing data processing systems are disclosed. The data processing systems may include hardware components that generate heat. The heat may be managed using flows of gasses. Filters may be used to screen particulates entrained in the flows of gasses. The data processing systems may include a system for managing accumulations of particulates over time. The system may refresh the filters over time by reducing the particulate accumulations on the filters.

20 Claims, 12 Drawing Sheets

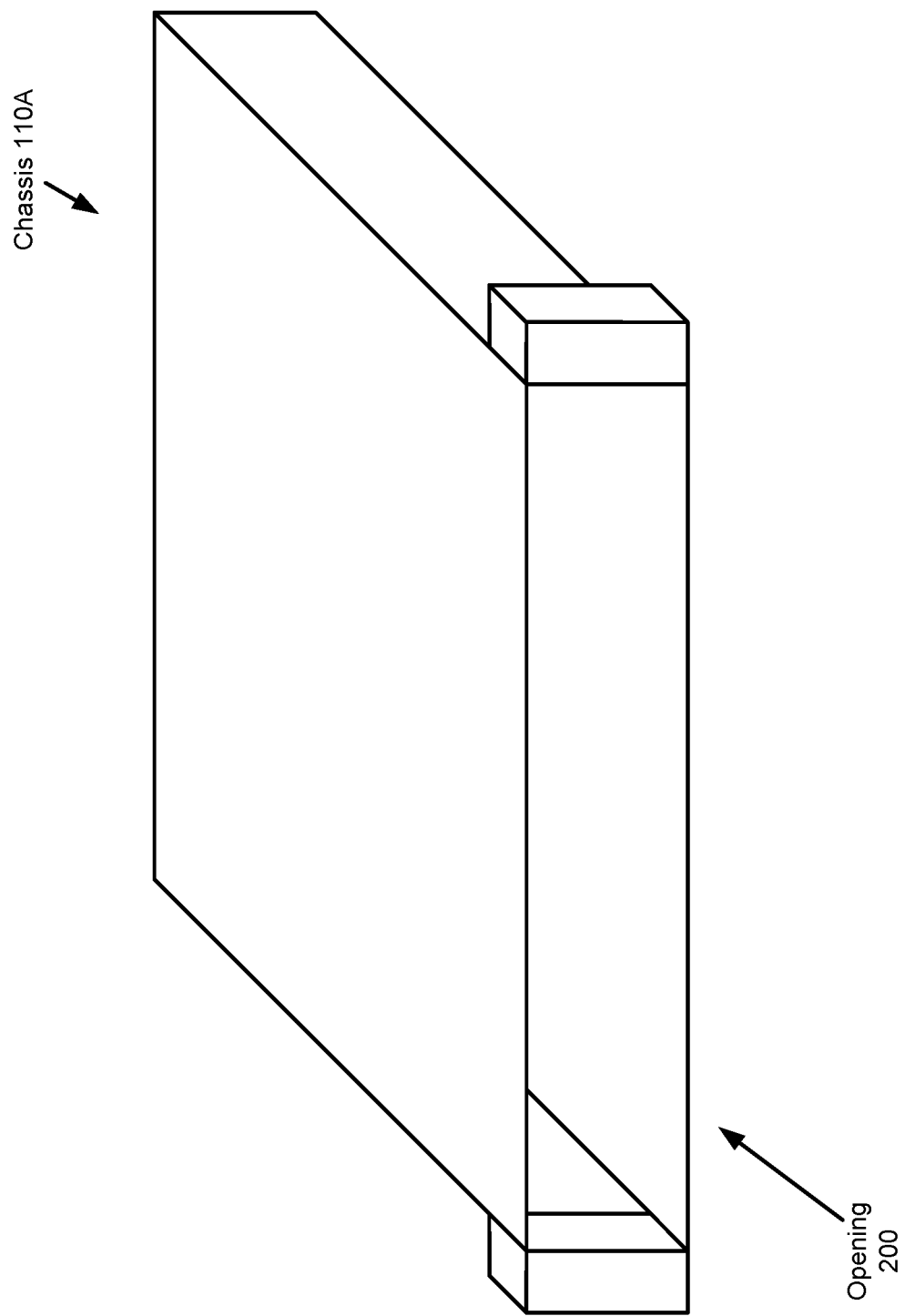

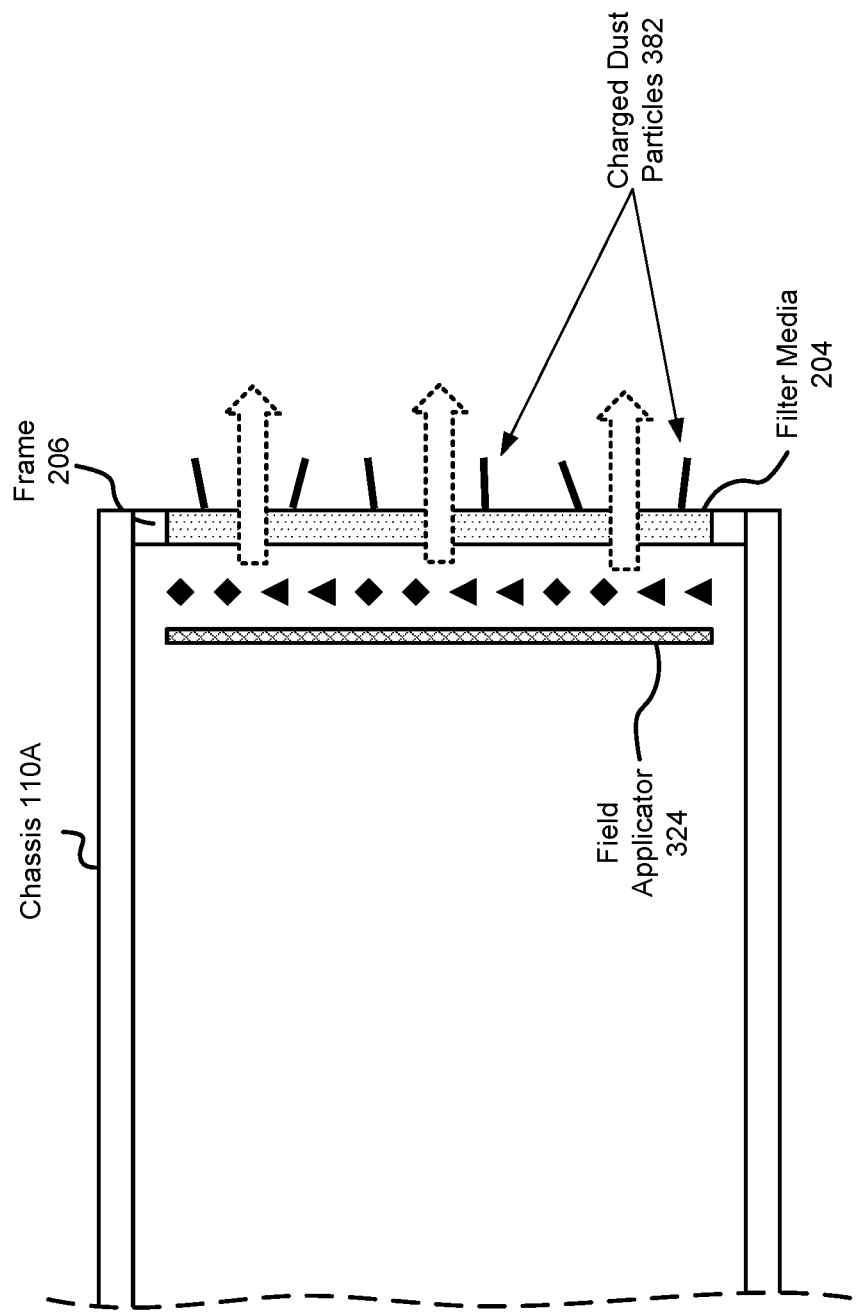

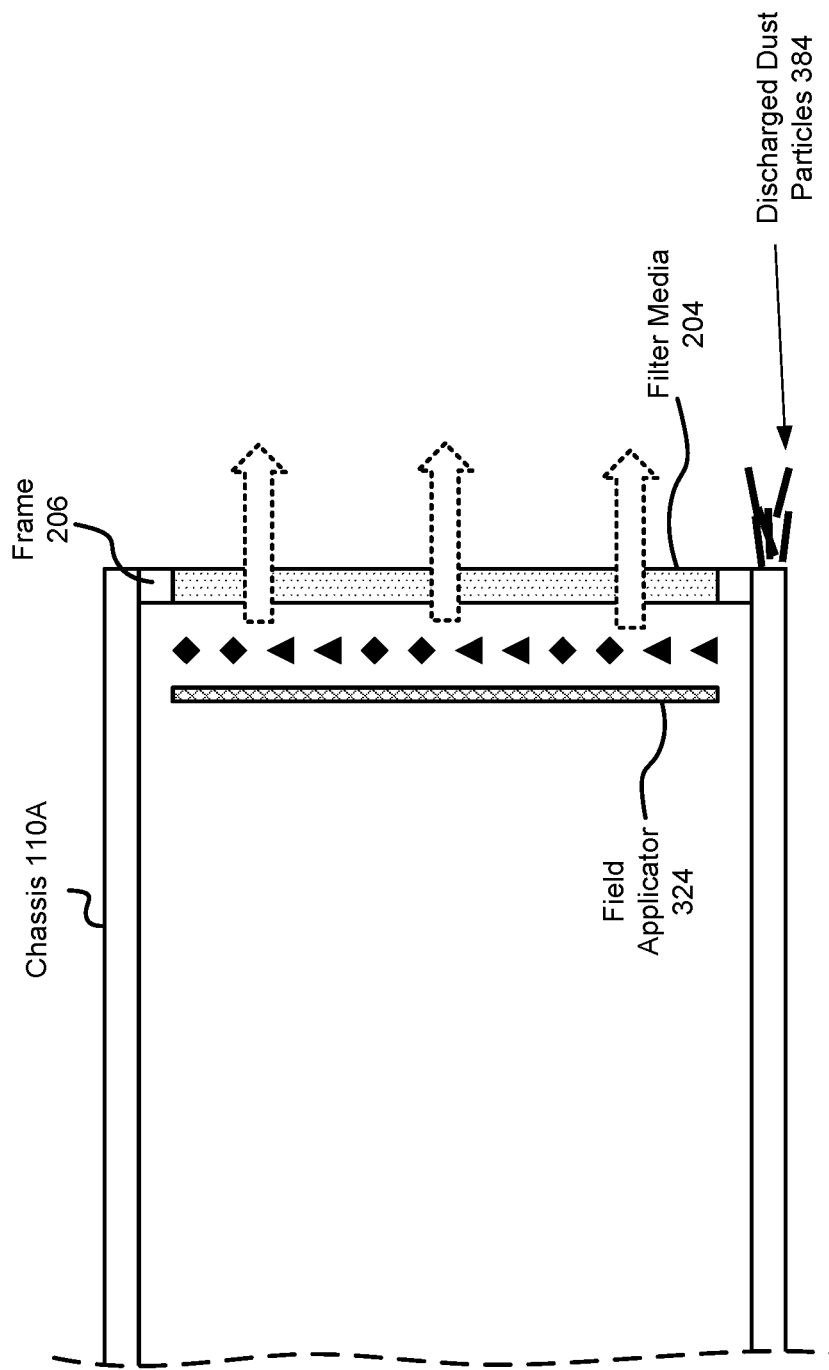

MANAGEMENT OF HARDWARE IN ENVIRONMENTS THAT INCLUDE PARTICULATES

FIELD OF THE DISCLOSURE

Embodiments disclosed herein generally relate to a device management. More particularly, embodiments disclosed herein relate to systems and methods to manage hardware of devices in environment that include particulates.

BACKGROUND

Computing devices may provide various types of computer implemented services. To provide the computer-implemented services, computing devices may include various type of hardware devices such as, for example, processors, memory modules, and storage devices. These hardware components may need to be positioned with one another to provide their respective functions. Similarly, various components devices may be aggregated together to form a computing system.

BRIEF DESCRIPTION OF THE DRAWINGS

Embodiments disclosed herein are illustrated by way of example and not limitation in the figures of the accompanying drawings in which like references indicate similar elements.

FIGS. 2A-2B show diagrams illustrating a chassis in accordance with an embodiment.

FIGS. 3A-3G show diagrams illustrating a particulate management system in accordance with an embodiment.

DETAILED DESCRIPTION

Figure 1:
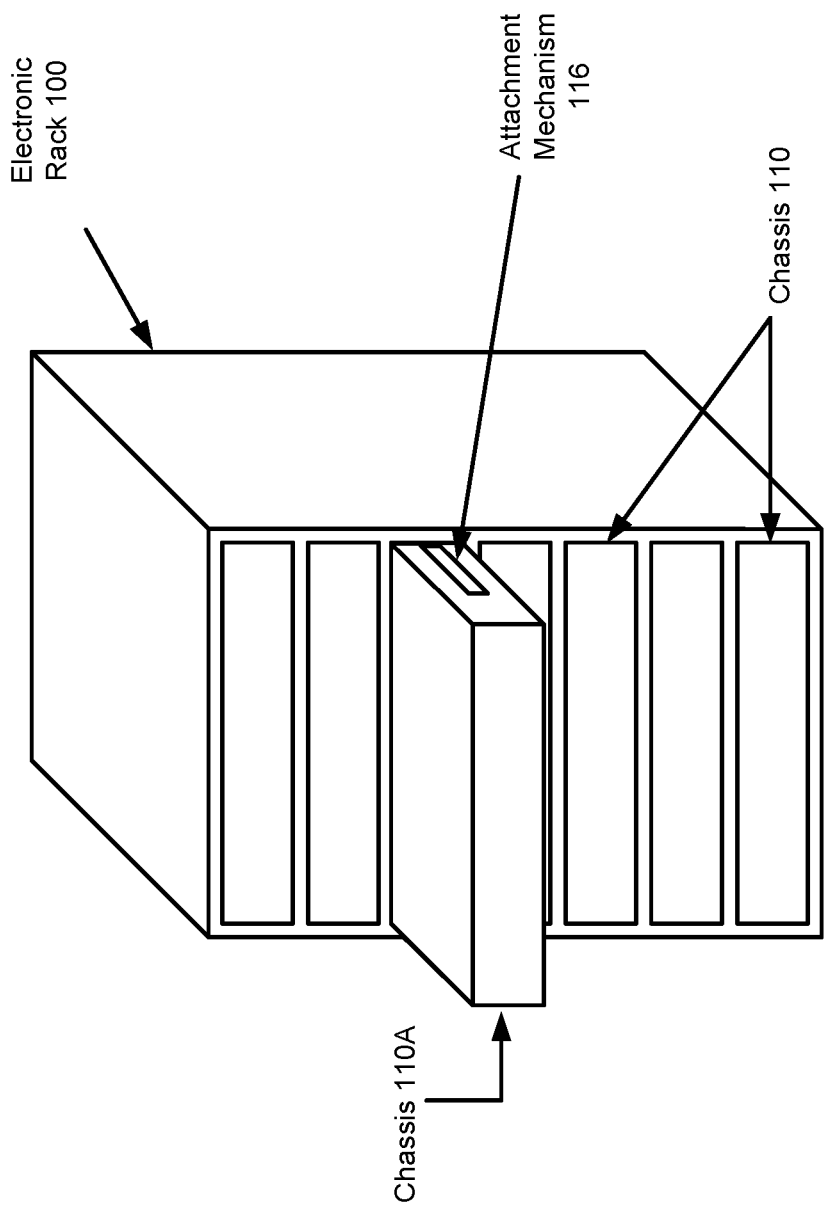
FIG. 1 shows a diagram illustrating an electronic rack in accordance with an embodiment.

Various embodiments will be described with reference to details discussed below, and the accompanying drawings will illustrate the various embodiments. The following description and drawings are illustrative of the embodiment disclosed herein and are not to be construed as limiting the disclosed embodiments. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment disclosed herein. The appearances of the phrases "in one embodiment", "an embodiment", and similar recitations in various places in the specification do not necessarily all refer to the same embodiment.

In general, embodiments disclosed herein relate to devices, systems, and methods for managing gas flow in chassis. The gas flow may be managed to facilitate cooling of components positioned in the chassis (e.g., that may become impaired in operation without sufficient gas flow).

To control the flow of gas, particulate accumulations on a filter covering an opening through which gas flows may be reduced from time to time. The particulate accumulations may be reduced by electrically charging the particulates to induce migration of the particulates away from a filter media.

Once migrated away from the filter media, the particulates may be further migrated away from the chassis by discharging the charged particulates. Once discharged, gravity and/or other forces (e.g., airflow) may cause the particulates to move away from the server chassis. By doing so, the filter media may be refreshed (e.g., reducing the impedance of the filter media to flows of gasses).

By doing so, a system in accordance with an embodiment may be usable in a wider range of environments with reduced impacts to operation of the system. Thus, embodiments disclosed herein may provide an improved computing device that is able to operate more effectively in a wider range of environmental conditions.

In an embodiment, a method of managing hardware components positioned in a chassis of a data processing system is disclosed. The method may include identifying an occurrence of a particulate accumulation elimination event; based on the identifying of the occurrence: activating a field applicator to apply an electric field to a filtration media of a filter covering an opening in a chassis of the data processing system to charge at least a portion of particulates accumulated on the filtration media to a charge level to obtain charged particulates, the opening facilitate airflow through the chassis to dissipate heat from the hardware components; while the particulates are being charged to the charge level, identifying an occurrence of a charged particulates discharge event; based on the occurrence of the charged particulates discharge event: grounding at least a frame of the filter to discharge the charged particulates; while grounding the at least the frame of the filter, identifying that the particulate accumulation elimination event has ended; and deactivating the field applicator and allow the at least the frame to electrically float based on the end of the particulate accumulation elimination event.

Identifying the occurrence of the particulate accumulation eliminate event may include monitoring operation of a cooling system of the data processing system to obtain at least one metric; and comparing the metric to a threshold to identify the occurrence of the particulate accumulation elimination event.

The metric may include one selected from a group of metrics consisting of: a rate of the airflow through the chassis; and a power consumption rate of the cooling system for a given rate of the airflow through the chassis.

A schedule of when to clear the particulates from the filtration media may be maintained by the data processing system, and the occurrence of the particulate accumulation elimination may be a point in time defined by the schedule.

The field applicator may include an electromagnet positioned with the filtration media, and the electric field may be oriented through opening which the filtration media covers.

The particulates may include dust, and the data processing system may be positioned in an edge installation that does not provide filtered air to the data processing system for cooling.

Identifying the occurrence of the charged particulates discharge event may include: monitoring operation of a cooling system of the data processing system while the field applicator is active to obtain at least second metric; and comparing the second metric to a threshold to identify the occurrence of the charged particulates discharge event.

The second metric may include one selected from a group of metrics consisting of: a change in a rate of the airflow through the chassis; and a change in power consumption rate of the cooling system for a given rate of the airflow through the chassis.

Identifying the occurrence of the charged particulates discharge event may include monitoring a duration of time during which the field applicator is active. The charged particulates discharge event may be a predetermined duration of time while the field applicator is active.

The filtration media may have a pore size selected to screen the particulates from entering and interior of the chassis where the hardware components are loaded, and accumulation of the particulates on the filtration media may fill at least a portion of pores of the filtration media.

In an embodiment, a non-transitory media is provided. The non-transitory media may include instructions that when executed by a processor cause the computer-implemented method to be performed.

In an embodiment, a data processing system is provided. The data processing system may include the non-transitory media and a processor, and may perform the method when the computer instructions are executed by the processor.

Turning to FIG. 1, a diagram illustrating electronic rack 100 in accordance with an embodiment is shown. Electronic rack 100 may be used to store computing devices in one or more chassis 110. Chassis 110 may be physical devices for housing components such as computing devices.

In FIG. 1 and throughout, an example chassis is shown that conforms to a particular form factor (e.g., rack mount). However, it will be appreciated that embodiments disclosed herein may be used with respect to chassis that conform to other form factors without departing from the embodiments.

The computing device housed in chassis 110A may include one or more components. The component may include, for example, hardware devices that may varying in shape, performance, functionality, and/or other characteristics. The hardware devices may include one or more of the following types of hardware components: (i) memory modules such as random access memory (RAM), (ii) processing devices such as a central processing unit (CPU), (iii) storage devices such as hard disk drives, solid state drives, etc., (iv) input and output (I/O) devices, and/or (v) other types of hardware devices that may aid in providing computer implemented services.

One or more of chassis 110, such as chassis 110A, within electronic rack 100 may include an attachment mechanism (e.g., 116). Attachment mechanism 116 may include sliders or other physical structures for attaching a chassis to electronic rack 100. The attachment mechanism may also allow for the chassis to move within a limited range with respect to electronic rack 100. For example, the chassis may move into and/or out of electronic rack 100.

In FIG. 1, chassis 110A is illustrated in a first position (e.g., after sliding out of electronic rack 100, while other chassis are illustrated in a second position (e.g., after sliding into electronic rack 100).

Electronic rack 100 may include openings and/or corresponding attachment points for attachment mechanisms of chassis 110 to stack any number of chassis 110 with respect to one another. The openings and/or attachment points may be positioned based on the dimensions of chassis 110

While illustrated in FIG. 1 with respect to a limited number of specific components in specific positions and orientations, an electronic rack may include different number and/or types of components with different positions and/or orientations without departing from embodiments disclosed herein.

Turning to FIG. 2A, a first diagram of chassis 110A in accordance with an embodiment is shown. Chassis 110A may include one or more openings. These openings may allow gasses to flow through the interior of chassis 110A. The flow of gasses may be regulated, and used to thermally manage the hardware components within chassis 110A.

Figure 3A:
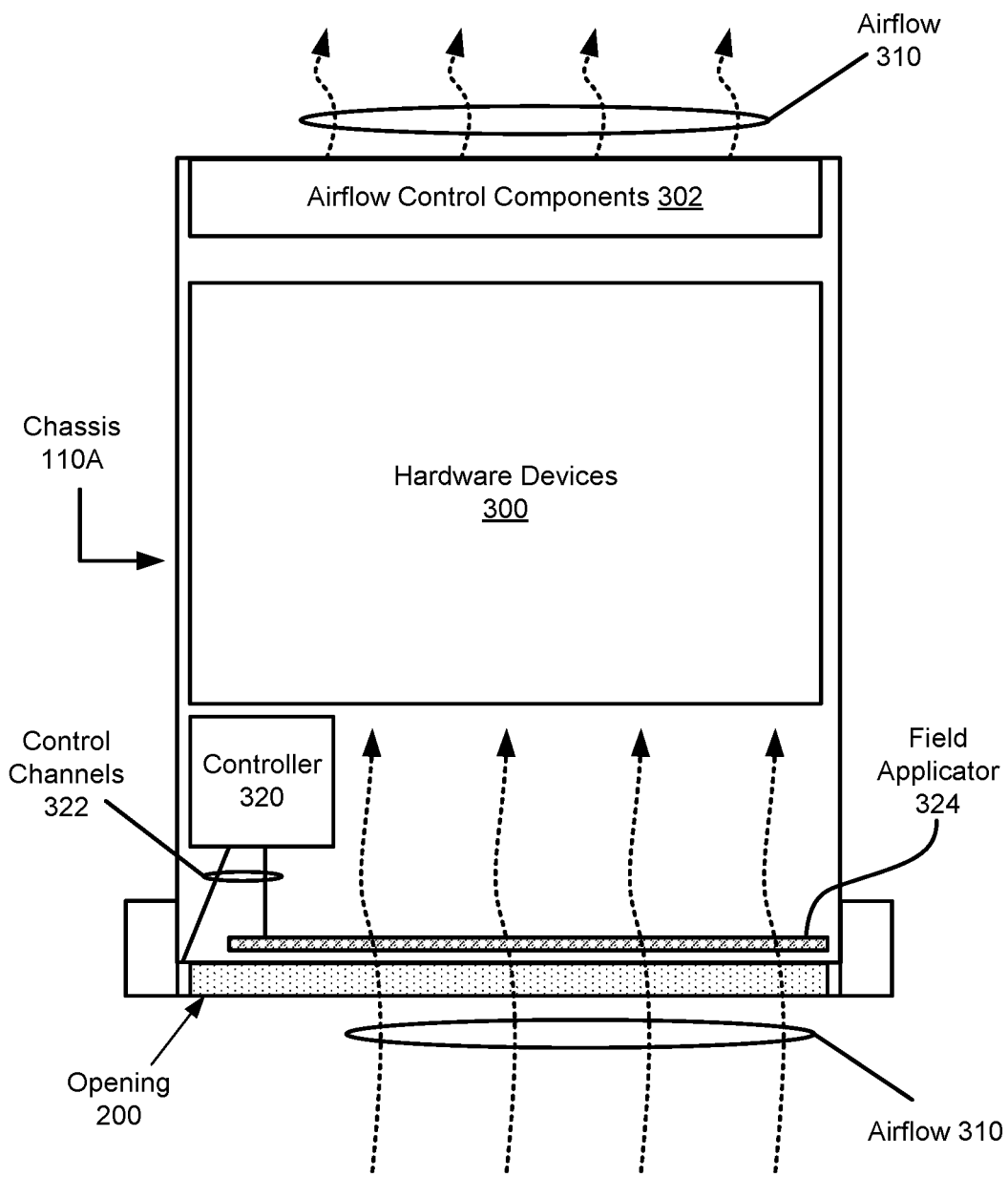

For example, during operation of a data processing system, hardware components of the data processing system may consume power and generate heat. To manage the heat, gasses may flow into or out of opening 200. The flow of gasses may carry the generated heat outside of chassis 110A. Refer to FIG. 3A for additional details regarding use of flows of gasses to dissipate heat generated by various hardware devices positioned in chassis 110A.

To efficiently dissipate heat, the hardware components may include heatsinks or other structures to facilitate dissipation of heat in the flows of gasses. However, if the heatsinks are covered in particulates (e.g., dust), then the rate at which heat may be dissipated may be impaired. For example, the dissipation rate may be less than desired. Additionally, particulate accumulation in the chassis may result in other undesired impacts on operation of the hardware components.

To reduce the impact of particulates included in flows of gasses on the hardware components, chassis 110A may include one or more filters.

Figure 2B:
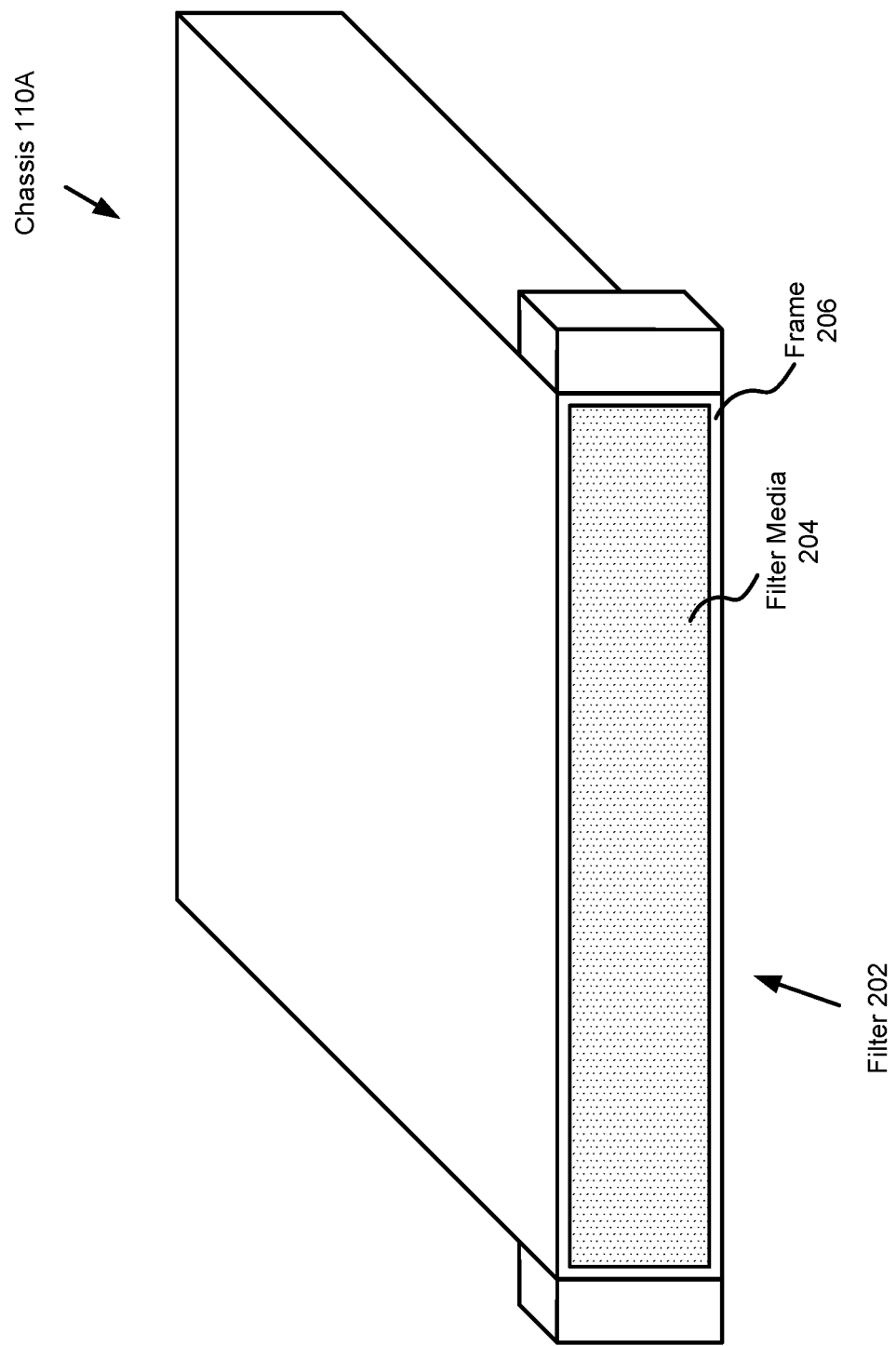

Turning to FIG. 2B, a second diagram of chassis 110A in accordance with an embodiment is shown. To reduce and/or prevent particulate accumulation in chassis 110, filter 202 may be positioned with a corresponding opening in chassis 110A. Filter 202 may cover the opening and screen particulates (e.g., above a size thresholds) from entering the interior of chassis 110A while still allowing gasses to flow into and/or out of the interior of chassis 110A through the opening.

Filter 202 may include filter media 204 and frame 206. Filter media 204 may include any type of filtering material (e.g., an open port structure). Filter media 204 may include holes having a size that blocks particulates above a predetermined size from passing through it while still allowing gasses to flow through it.

Frame 206 may include a structural member that supports filter media 204. For example, frame 206 may be a box frame that surrounds and supports filter media 204. Frame 206 may be formed from a conductive material that allows for it to be selectively grounded and/or may electrically float, as will be discussed in greater detail below.

For example, frame 206 may be electrically separated from other components of chassis 110 (e.g., may include a gasket or other material to separate it electrically). Thus, frame 206 may, depending on its electrical connectivity to other components, may be electrically charged or discharged.

However, over time, particulates may accumulate on filter media 204. Accumulation of the particulates may result in, for example, the rate of the flow of gasses through chassis 110A to be reduced, may require that control airflow components of chassis 110A operate at higher duty cycles and/or consume more power to generate a same level of airflow, and/or may otherwise impact the ability of the hardware components positioned in chassis 110A to be thermally managed.

In general, embodiments disclosed herein relate to system, methods, and devices for thermally managing hardware components within a chassis. To thermally manage the hardware components, a data processing system in accordance with embodiments disclosed herein may include a particulate management system (e.g., 390). The particulate management system may facilitate removal of accumulated particulates from filter media of filters used to screen particulates from the interior of a chassis of the data processing system.

To do so, the particulate management system may (i) electrically charge particulates positioned on a filter media to obtain charged particulates, (ii) by virtue of the charging of the particulates and the charge of a frame that supports the filter media, cause the particulates to migrate from the filter media to the frame thereby reducing the particulate load on the filter media (e.g., which may reduce airflow impedance due to the filter media and accumulated particulates), and (iii) after migration, discharge the particulates from the frame by discharge the charge from the charged particulates. By doing so, embodiments disclosed herein may prevent and/or reduce filter clogging thereby retaining the flow of gasses through an interior of the chassis.

Consequently, a data processing system in accordance with embodiments disclosed herein may have improved usability by virtue of its ability to operate in particulate laden environments. For example, the data processing system may operate in edge installations where filter supplies of gasses may be unavailable. Rather, the data processing system may utilize unfiltered air to cool hardware components (e.g., also referred to as hardware devices) of the data processing system.

In contrast, data processing systems that lack a particulate management system may be impacted by such particulate laden environments. For example, if filters are in place, the filters may clog and require replacement overtime. In another example, if no filters are in place, then the particulates may flow into the chassis eventually impacting the operation of the hardware components positioned in the chassis. Thus, the disclosed data processing systems in accordance with embodiments may be more likely to successfully operate across a wider range of environmental conditions. Refer to FIGS. 3A-3G for additional details regarding particulate management systems.

Figure 3B:
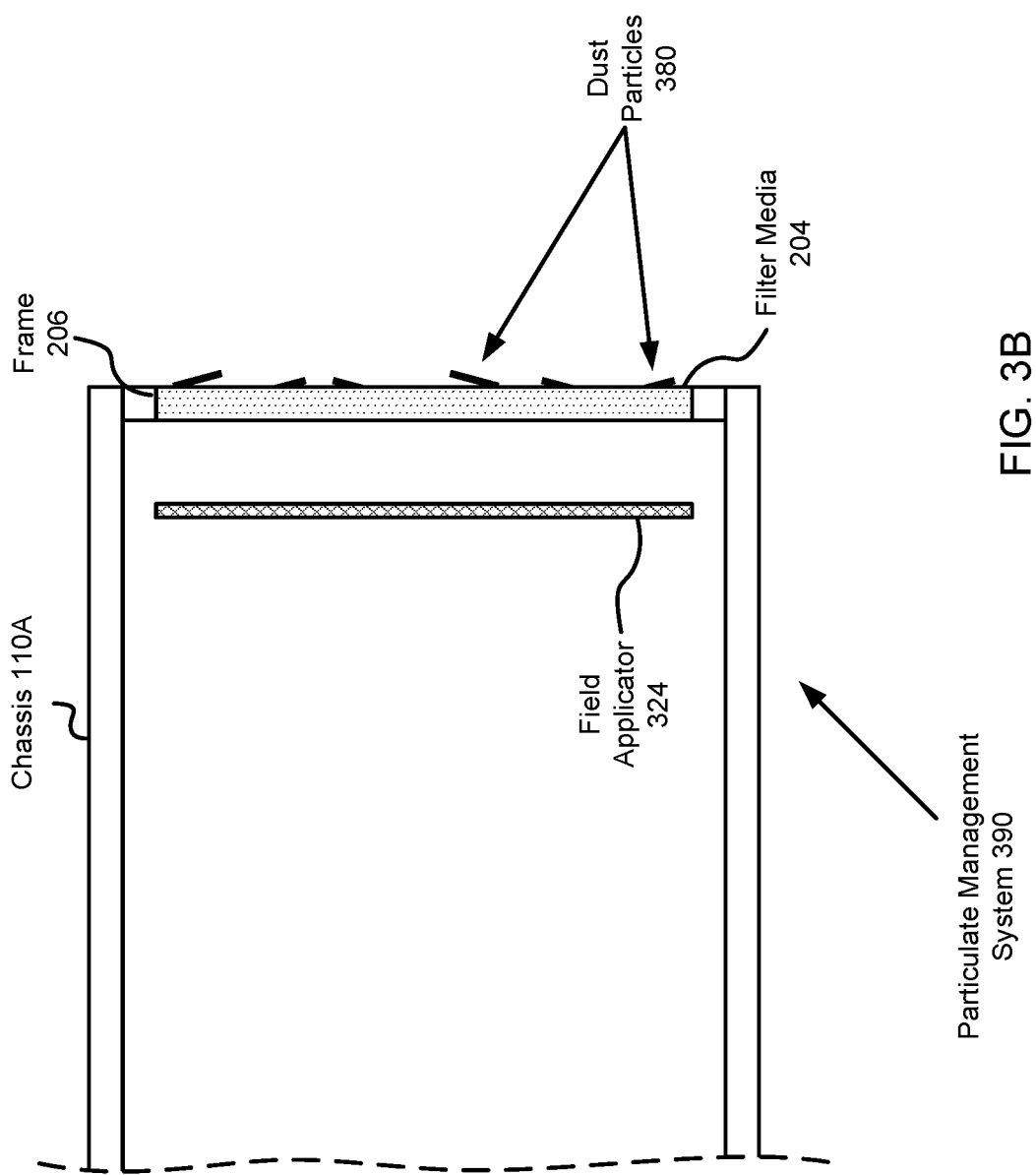
Figure 3C:
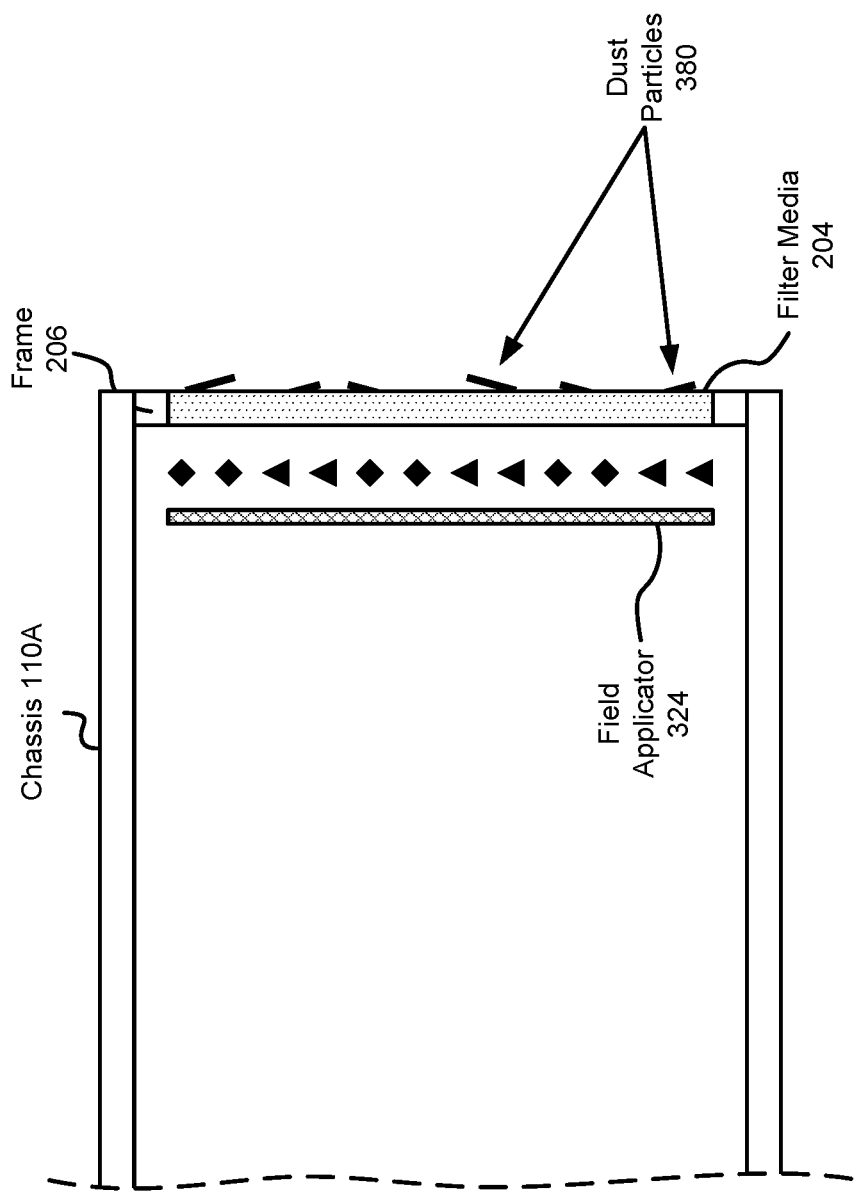
Figure 3D:
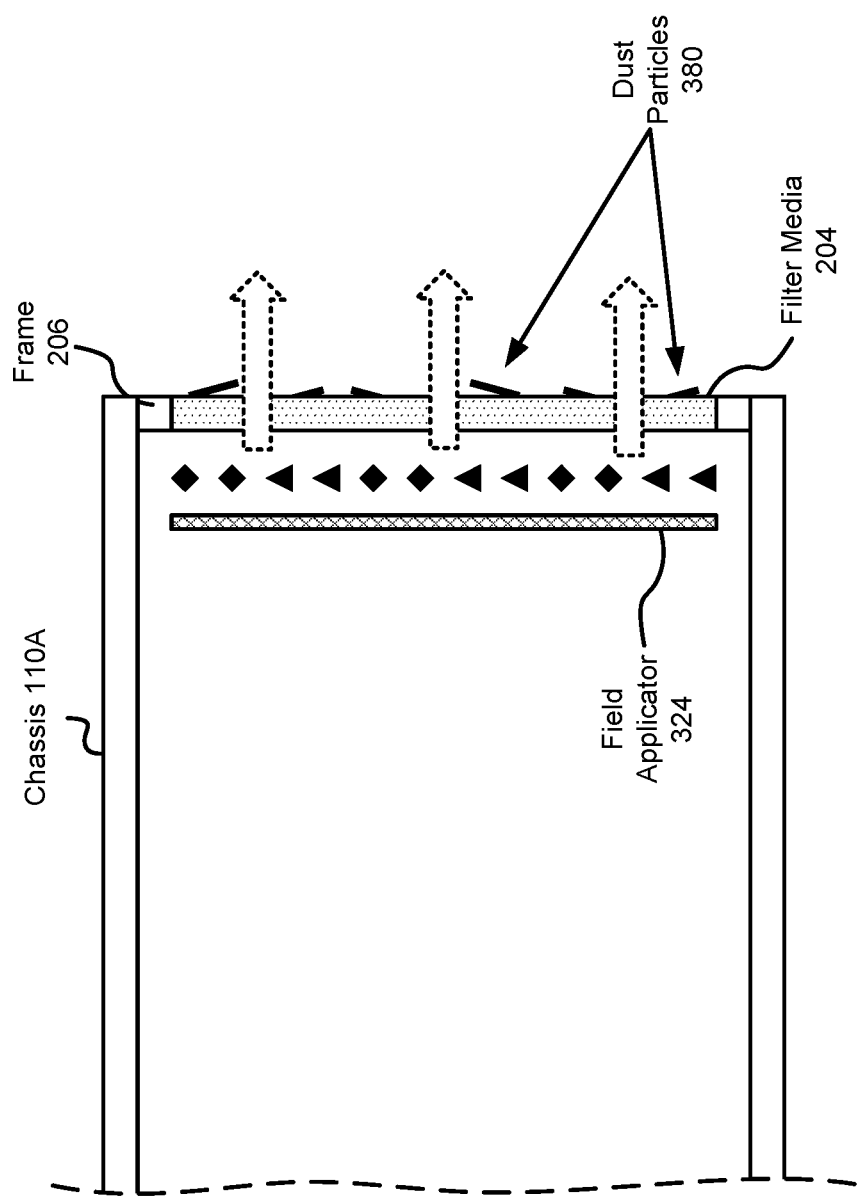
Figure 3F:
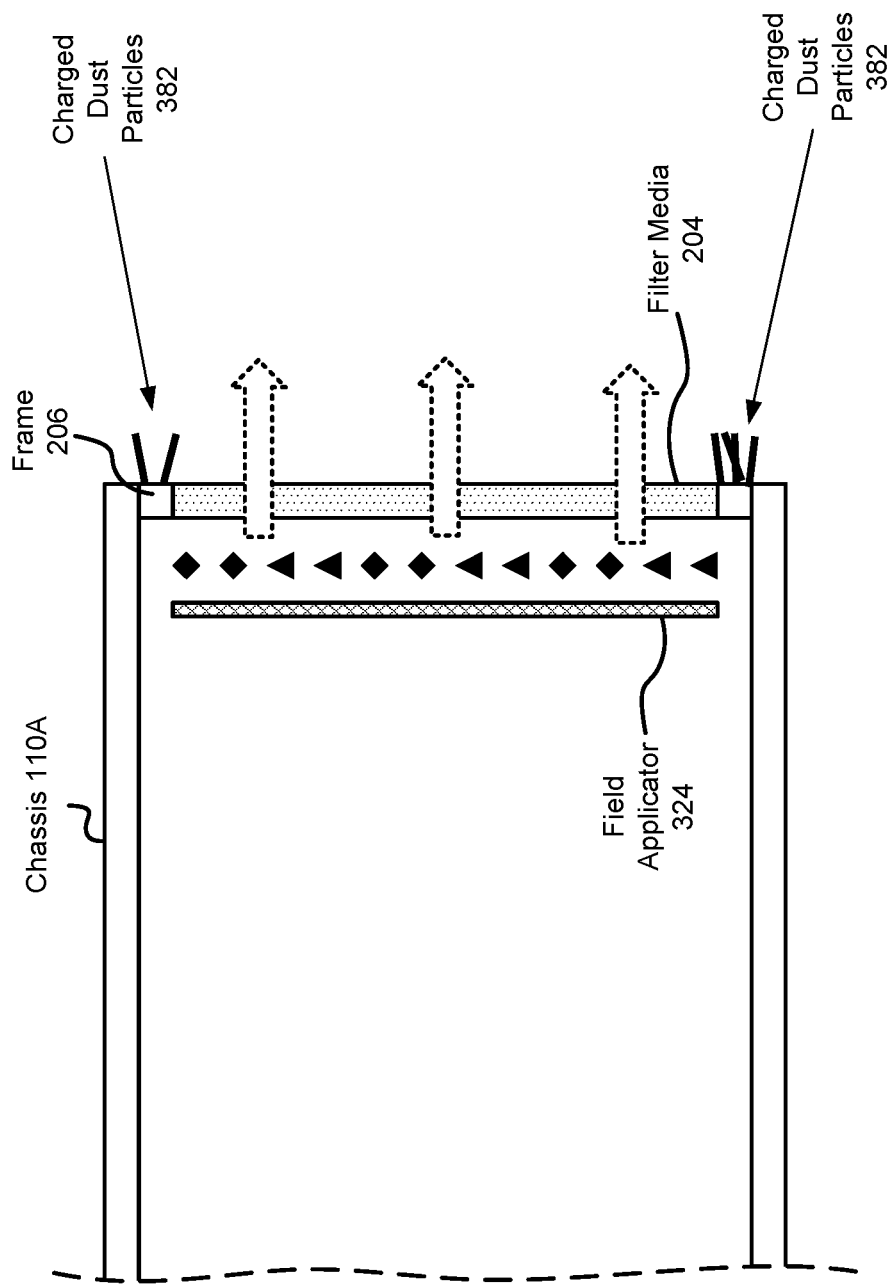
Figure 4:
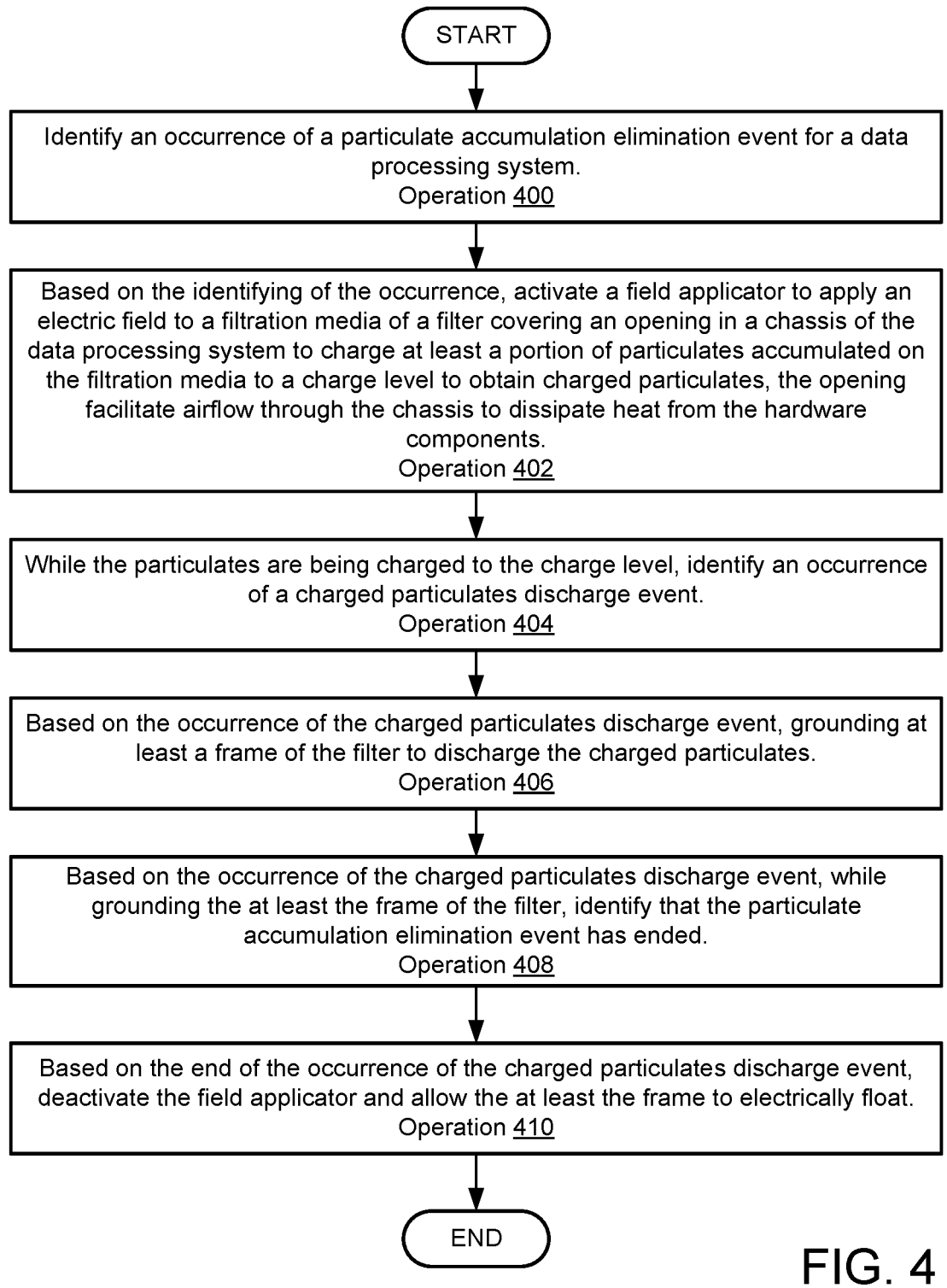
FIG. 4 shows a flow diagram illustrating a method of managing configuration of a data processing system in accordance with an embodiment.

When providing its functionality, a data processing system in accordance with an embodiment may perform all, or a portion, of the actions and methods illustrated in FIGS. 3A-4.

A data processing system may be implemented using a computing device such as a host or a server, a personal computer (e.g., desktops, laptops, and tablets), a "thin" client, a personal digital assistant (PDA), a Web enabled appliance, a mobile phone (e.g., Smartphone), an embedded system, local controllers, an edge node, and/or any other type of data processing device or system. For additional details regarding computing devices, refer to FIG. 5.

While illustrated in FIGS. 1-2B as including a limited number of specific components, a system in accordance with an embodiment may include fewer, additional, and/or different components than those illustrated therein.

Turning to FIG. 3A, a top view diagram of chassis 110A in accordance with an embodiment is shown. In FIG. 3A, flows of gasses are illustrated using dashed wavy lines terminating in arrows.

To manage flows of gasses (e.g., airflow 310) into and out of chassis 110A, airflow control components 302 may be positioned within chassis 110A. The airflow control components may include, for example, fans that may selectively generate airflows. The flows of air may traverse proximate to hardware devices 300, thereby removing heat from hardware devices 300 which may generate heat in their operation.

However, the fans and/or other components may have a limited capacity for generating airflow. Consequently, particulates accumulating on the filter may reduce the ability of airflows to be generated by airflow control components 302.

To reduce the impact of particulates, a particulate management system may be positioned with the filter. The particulate management system may include field applicator 324, control channels 322, and controller 320.

Field applicator 324 may selectively generate magnetic and electric fields. When generated, the electric fields may charge the particulates that have accumulated on the filter.

Controller 320 may control when electric fields are generated by field applicator 324. To do so, controller 320 may monitor various aspects of the operation of the data processing system (e.g., which may include hardware devices 300, airflow control components 302, etc.).

For example, controller 320 may monitor the power consumed by and/or airflow generated by airflow control components 302 under various conditions. To do so, controller 320 may communicate with various sensors and/or other components.

In another example, controller 320 may keep track of time and initiate application of fields in accordance with a schedule or other time based metrics. It will be appreciated that a combination of different metrics (e.g., time, sensed airflow, power consumption to generate airflow) may be used as basis for deciding when to apply fields.

Once controller 320 determined that it is time to apply a field, controller 320 may apply power to field applicator 324 via control channels 322. Control channels may operably connect controller 320 to devices (e.g., transistors) that control when power is applied to field applicator 324 and/or when the frame of the filter is grounded versus left floating.

To apply the field, field applicator 324 may include electromagnetics which may selectively generate fields. Refer to FIGS. 3B-3G for additional details regarding the electromagnetic and fields generated by the electromagnets.

By virtue of the application of the fields, the particulates accumulated on the filter media may become charged. The charge on the particles may attract the particles to the nearby frame thereby causing the charged particles to migrate to the frame.

Once migrated, controller 320 may discharge the charged particles thereby removing their attraction to the frame. The particles may be discharged by grounding the frame (which may have been previously floating thereby allowing for charge to form on the frame attracting the charged particles. The loss of attraction may cause gravity and/or other forces to direct the particles to fall away from the frame and/or otherwise leave the vicinity of the filter media.

Once the cycle is complete, power may be withdrawn from field applicator 324 and/or the frame may be left to float (in other words, the frame may not be grounded any more) until a sufficient quantity of the particulates have accumulated on the filter media to warrant repeating the aforementioned process.

The process may be controlled similarly to the initiation of the cycle. In other words, the portions of the cycle may be performed in accordance with a scheduled and/or based on occurrences of conditions (e.g., related to the quantity of particulates that are still accumulated on the filter media).

To further clarify the cycle, example diagrams illustrating aspects of the cycle are shown in FIGS. 3B-3G. In each of these figures, a side view diagram of chassis 110A is shown.

The respective figures illustrate portions of the process that may occur in the corresponding temporal order. In other words, the state of the system shown in FIG. 3B may occur prior to the state of the system shown in FIG. 3C.

Turning to FIG. 3B, a first side view diagram of chassis 110A in accordance with an embodiment is shown. As airflow traverses through chassis 110A through filter media, dust particles 380 may accumulate on filter media 204. In FIG. 3B, the dust particles are drawn using oblong shapes but it will be appreciated that various dust particles may have different shapes.

To manage the accumulated particulates, field applicator 324 may be positioned with filter media 204. Field applicator 324 may include one or more electromagnets. When powered, the electromagnetics may generate a magnetic field which may in turn generate an electric field.

Turning to FIG. 3C, a second side view diagram of chassis 110A in accordance with an embodiment is shown.

Once power is applied to field applicator 324, field applicator may generate a magnetic field. Different portions of the magnetic field may be oriented into and/or out of the page. In FIG. 3C, filled triangles and diamonds are included to illustrate the orientation of a select number of portions of the generated magnetic field.

While illustrated as having a field distribution that reverses a number of times across the height of the sheet, it will be appreciated that the field distribution may be different (e.g., top have may be oriented into the page and bottom half oriented out of the page). The field distribution may depend on the specific implementation of the electromagnet.

For example, the electromagnet may be implemented using a wire wound magnetic core. The windings on the magnetic course may, when current flows through the windings, generate a magnetic field that circulates through the core (e.g., may be toroidal in shape, or a different shape). Field applicator 324 may include one or more of such wound cores. The core may be an air core or a ferrite or other type of magnetizable core.

Turning to FIG. 3D, a third side view diagram of chassis 110A in accordance with an embodiment is shown.

The resulting magnetic field may induce generation of a corresponding electric field. In FIG. 3D, a portion of the generated electric field is illustrated using oversized arrows drawn in dashed outlining. The electric field, as seen in FIG. 3D, may extend away from field applicator 324 through filter media 204 thereby charging dust particles 380 positioned on filter media.

Turning to FIG. 3E, a fourth side view diagram of chassis 110A in accordance with an embodiment is shown.

Once sufficiently charged, charged dust particles 382 orient themselves with the orientation of the electric field and begin to progressively more attracted to frame 206. As the charge level increases, the attraction to frame 206 may cause the charged dust particles to migrate to frame 206.

Turning to FIG. 3F, a fifth side view diagram of chassis 110A in accordance with an embodiment is shown.

Once a sufficient quantity of the particles have migrated, the particulate management system may identify that filter media 204 is sufficient clear of particulates. When so identified, the controller may ground frame 206 thereby discharging both the frame and the charged dust particles.

Turning to FIG. 3G, a sixth side view diagram of chassis 110A in accordance with an embodiment is shown.

Once discharged, discharged charged dust particles 384 may no longer be attracted to frame 206. Consequently, other forces (e.g., gravity) may cause the discharged dust particles to migrate away from frame 206 and filter media 204. For example, gravity may cause the discharged dust particles to fall down to the ground.

During this process, the controller may instruct the airflow control components to temporarily stop drawing in air via filter media 204. For example, the airflow may be at least temporarily reversed during this portion of the process to apply forces to discharged dust particles 384 that may drive them away from filter media 204 thereby reducing the likelihood of the discharged dust particles from accumulating on filter media 204 in the future.

Thus, via the process illustrated in FIGS. 3A-3G, accumulated particulates may be migrated away from filter media thereby reducing clogging of the filter media and renewing its life future use.

As discussed above, the components of FIG. 1 may perform various methods to manage data processing systems. FIG. 4 illustrates methods that may be performed by the components of FIGS. 1-3G. In the diagram discussed below and shown in FIG. 4, any of the operations may be repeated, performed in different orders, and/or performed in parallel with or in a partially overlapping in time manner with other operations.

Turning to FIG. 4, a flow diagram illustrating a method of managing operation of a data processing system in accordance with an embodiment is shown. The method may be performed, for example, by any of the device shown in FIG. 1 (e.g., data processing systems housed in chassis), various components of the devices, and/or other devices not shown in FIGS. 1-3G.

At operation 400, an occurrence of a particulate accumulation elimination event is identified. The particulate accumulation elimination event may be identified by (i) reviewing a schedule, (ii) obtaining and reviewing monitoring information regarding the particulate accumulation level of filters (and/or sensor data usable to infer the accumulation level), and/or via other methods.

For example, if governed by a schedule of when cycles for particulate accumulation elimination are to be performed, the current time may be compared to the schedule to identify when particulate accumulation elimination events are occurring.

In another example, the particulate accumulation elimination event may be identified by reviewing sensor data. The sensor data may be usable to diagnose a particulate accumulation level on a filter media of a filter. The sensor data may be related to (i) airflow rates through a chassis, (ii) power consumption levels of airflow control components used to establish a predetermined airflow rate, (iii) optical, acoustic, and/or other types of direct measurements of the particulates and/or filter media itself, etc. The sensor data may be compared to criteria (e.g., thresholds) that when met indicate that a particulate accumulation elimination event has occurred.

At operation 402, based on the identifying of the occurrence of the particulate accumulation elimination event, a field applicator is activated to apply an electric field to a filtration media (e.g., a filter media) covering an opening in a chassis of the data processing system to charge at least a portion of particulates that have accumulated on the filtration media to a charge level to obtain charged particulates. The opening may facilitate airflow through the chassis to dissipate heat from hardware components of the data processing system. The field applicator may be activated by powering the field applicator (e.g., causing current to flow through coils of an electromagnet thereby generating a magnetic field and corresponding electric field to charge the particulates accumulated on the filter).

The resulting charged particulates may migrate towards the frame of the filter thereby reducing the particulate accumulation level on the filter media.

At operation 404, while the particulates are being charged to the charge level, an occurrence of a charged particulates discharge event is identified. The charged particulates discharge event may be identified by (i) reviewing the schedule (e.g., which may specify a duration of time for the charging for the charging of the particulates), (ii) obtaining and reviewing monitoring information regarding the particulate accumulation level of filter media (and/or sensor data usable to infer the accumulation level), and/or via other methods.

If monitoring is performed, the monitored sensor data may be used to infer when the particulates accumulation level on the filter media has been reduced by or to a desired amount.

At operation 406, based on the occurrence of the charged particulates discharge event, at least a frame of the filter is grounded to discharge the charged particulates. The frame may be discharged by electrically coupling the frame to a ground line. For example, a switch or other type of device may be activated thereby electrically grounding the frame. Similarly processes may be used if other components (e.g., various portions of the chassis) are also grounded. Discharging the charged particles may eliminate an electrostatic attractive force between the particulates and the frame. Consequently, the particulates may fall away from the frame and/or otherwise migrate away from the filter media.

At operation 408, also based on the occurrence of the charged particles discharge event and while grounding the at least the frame of the filter, an identification is made that the particulate accumulation elimination event has ended. The identification may be made by (i) reviewing the schedule (e.g., which may specify a duration of time for grounding the frame), (ii) obtaining and reviewing monitoring information regarding the particulate accumulation level of the filter media (and/or sensor data usable to infer the accumulation level which may be compared to criteria that when met indicates that the even has ended), and/or via other methods.

At operation 410, based on the end of the occurrence of the charged particles discharge event, the field applicator is deactivated and the at least the frame is allowed to electrically float. The field applicator may be deactivated by depowering it (and/or portions of it), and the frame may be allowed to electrically float by electrically isolating it from the ground potential (e.g., using switches and/or other components).

The method may end following operation 410.

Thus, using the method illustrated in FIG. 4, embodiments disclosed herein may facilitate reduction in levels of particulate accumulations that may otherwise impact operation of a data processing system.

During the method shown in FIG. 4, various airflow control components may be selectively activated and/or deactivated. For example, during operations 400, 402, 404, 406, 408, and 410, any of the airflow control components may be deactivated to reduce forces applied to the particulates that may cause the particulates to remain accumulated. Likewise, during some operations, the airflow control components may be selectively activated to assist in reduction of particulate accumulations. For example, during operations 406-408, the airflow control components may be selectively activated to generate a reverse airflow that may facilitate migration of the discharged particulates away from the data processing system.

Figure 5:
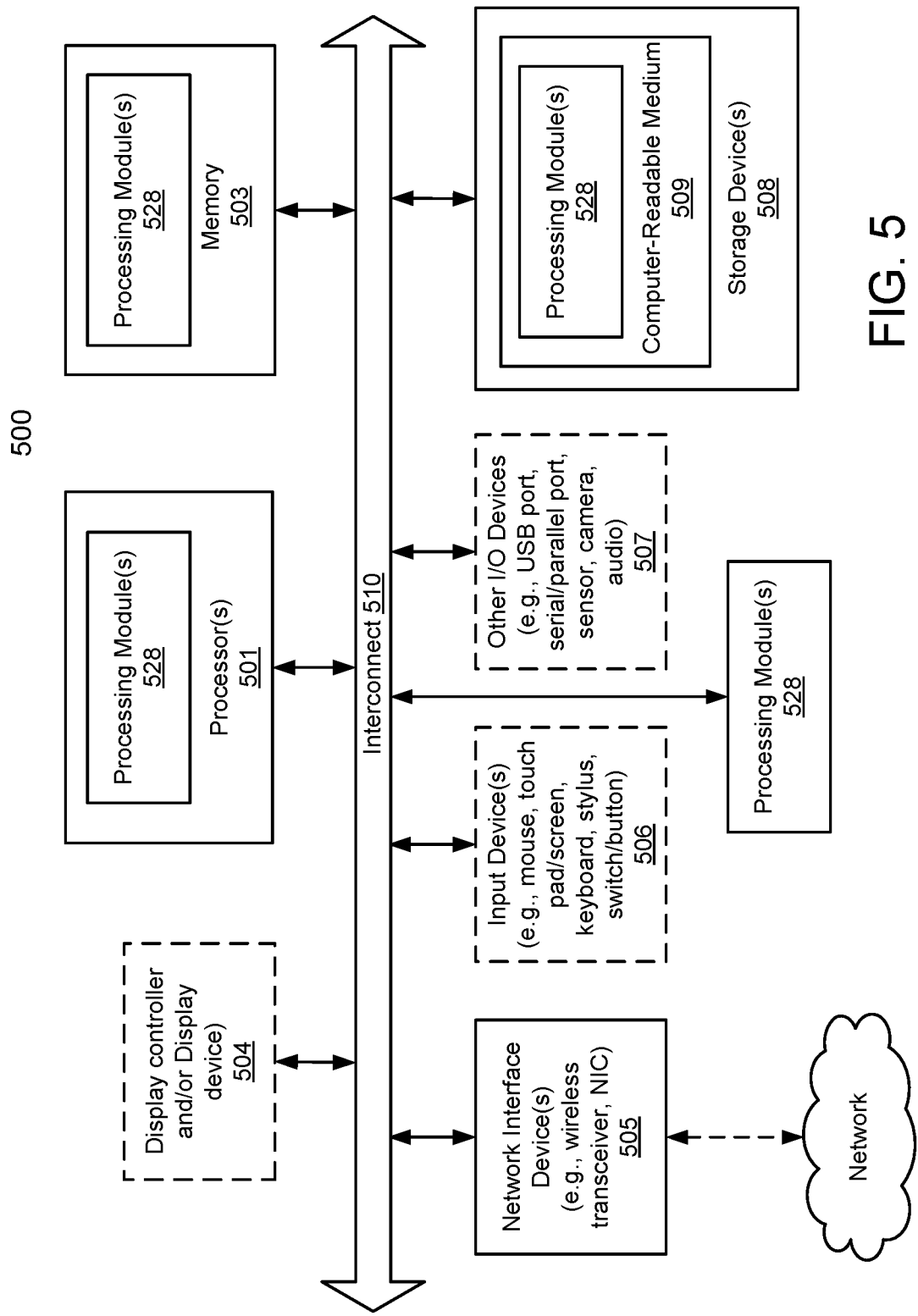
FIG. 5 shows a block diagram illustrating a data processing system in accordance with an embodiment.

Any of the components illustrated in FIGS. 1-3G may be implemented with one or more computing devices. Turning to FIG. 5, a block diagram illustrating an example of a data processing system (e.g., a computing device) in accordance with an embodiment is shown. For example, system 500 may represent any of data processing systems described above performing any of the processes or methods described above, and may include the illustrated components as well as any of the other components discussed with respect to FIGS. 1-3G. System 500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 500 is intended to show a high-level view of many components of the computer system. However, it is to be understood that additional components may be present in certain implementations and furthermore, different arrangement of the components shown may occur in other implementations. System 500 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 500 includes processor 501, memory 503, and devices 505-507 via a bus or an interconnect 510. Processor 501 may represent a single processor or multiple processors with a single processor core or multiple processor cores included therein. Processor 501 may represent one or more general-purpose processors such as a microprocessor, a central processing unit (CPU), or the like. More particularly, processor 501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 501, which may be a low power multi-core processor socket such as an ultra-low voltage processor, may act as a main processing unit and central hub for communication with the various components of the system. Such processor can be implemented as a system on chip (SoC). Processor 501 is configured to execute instructions for performing the operations discussed herein. System 500 may further include a graphics interface that communicates with optional graphics subsystem 504, which may include a display controller, a graphics processor, and/or a display device.

Processor 501 may communicate with memory 503, which in one embodiment can be implemented via multiple memory devices to provide for a given amount of system memory. Memory 503 may include one or more volatile storage (or memory) devices such as random-access memory (RAM), dynamic RAM (DRAM), synchronous DRAM (SDRAM), static RAM (SRAM), or other types of storage devices. Memory 503 may store information including sequences of instructions that are executed by processor 501, or any other device. For example, executable code and/or data of a variety of operating systems, device drivers, firmware (e.g., input output basic system or BIOS), and/or applications can be loaded in memory 503 and executed by processor 501. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 500 may further include IO devices such as devices (e.g., 505, 506, 507, 508) including network interface device(s) 505, optional input device(s) 506, and other optional IO device(s) 507. Network interface device(s) 505 may include a wireless transceiver and/or a network interface card (NIC). The wireless transceiver may be a Wi-Fi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 506 may include a mouse, a touch pad, a touch sensitive screen (which may be integrated with a display device of optional graphics subsystem 504), a pointer device such as a stylus, and/or a keyboard (e.g., physical keyboard or a virtual keyboard displayed as part of a touch sensitive screen). For example, input device(s) 506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 507 may include an audio device. An audio device may include a speaker and/or a microphone to facilitate voice-enabled functions, such as voice recognition, voice replication, digital recording, and/or telephony functions. Other IO devices 507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 510 via a sensor hub (not shown), while other devices such as a keyboard or thermal sensor may be controlled by an embedded controller (not shown), dependent upon the specific configuration or design of system 500.

To provide for persistent storage of information such as data, applications, one or more operating systems and so forth, a mass storage (not shown) may also couple to processor 501. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 501, e.g., via a serial peripheral interface (SPI). This flash device may provide for non-volatile storage of system software, including a basic input/output software (BIOS) as well as other firmware of the system.

Storage device 508 may include computer-readable storage medium 509 (also known as a machine-readable storage medium or a computer-readable medium) on which is stored one or more sets of instructions or software (e.g., processing module, unit, and/or processing module/unit/logic 528) embodying any one or more of the methodologies or functions described herein. Processing module/unit/logic 528 may represent any of the components described above. Processing module/unit/logic 528 may also reside, completely or at least partially, within memory 503 and/or within processor 501 during execution thereof by system 500, memory 503 and processor 501 also constituting machine-accessible storage media. Processing module/unit/logic 528 may further be transmitted or received over a network via network interface device(s) 505.

Computer-readable storage medium 509 may also be used to store some software functionalities described above persistently. While computer-readable storage medium 509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 528, components and other features described herein can be implemented as discrete hardware components or integrated in the functionality of hardware components such as ASICS, FPGAs, DSPs, or similar devices. In addition, processing module/unit/logic 528 can be implemented as firmware or functional circuitry within hardware devices. Further, processing module/unit/logic 528 can be implemented in any combination hardware devices and software components.

Note that while system 500 is illustrated with various components of a data processing system, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A method of managing hardware components positioned in a chassis of a data processing system, the method comprising and by a hardware processor of the data processing system:
    identifying an occurrence of a particulate accumulation elimination event, the hardware processor being coupled to a memory of the data processing system, the memory storing instructions that when executed by the hardware processor causes the hardware processor to perform the method, and the hardware processor and memory being ones of the hardware components;
    based on the identifying of the occurrence:
        activating a field applicator to apply an electric field to a filtration media of a filter covering an opening in a chassis of the data processing system to charge at least a portion of particulates accumulated on the filtration media to a charge level to obtain charged particulates, the opening facilitating airflow through the chassis to dissipate heat from the hardware components;
    while the particulates are being charged to the charge level, identifying an occurrence of a charged particulates discharge event;
    based on the occurrence of the charged particulates discharge event:
        grounding at least a frame of the filter to discharge the charged particulates;
        while grounding the at least the frame of the filter, identifying that the particulate accumulation elimination event has ended; and
        deactivating the field applicator and allow the at least the frame to electrically float based on the end of the particulate accumulation elimination event.

2. The method of claim 1, wherein identifying the occurrence of the particulate accumulation eliminate event comprises, by the hardware processor:
    monitoring operation of a cooling system of the data processing system to obtain at least one metric; and
    comparing the metric to a threshold to identify the occurrence of the particulate accumulation elimination event.

3. The method of claim 2, wherein the metric comprises one selected from a group of metrics consisting of:
    a rate of the airflow through the chassis; and
    a power consumption rate of the cooling system for a given rate of the airflow through the chassis.

4. The method of claim 1, wherein a schedule of when to clear the particulates from the filtration media is maintained by the data processing system, and the occurrence of the particulate accumulation elimination is a point in time defined by the schedule.

5. The method of claim 1, wherein the field applicator comprises an electromagnet positioned with the filtration media, and the electric field is oriented through opening which the filtration media covers.

6. The method of claim 1, wherein the particulates comprise dust, and the data processing system is positioned in an edge installation that does not provide filtered air to the data processing system for cooling.

7. The method of claim 1, wherein identifying the occurrence of the charged particulates discharge event comprises, by the hardware processor:
    monitoring operation of a cooling system of the data processing system while the field applicator is active to obtain at least second metric; and
    comparing the second metric to a threshold to identify the occurrence of the charged particulates discharge event.

8. The method of claim 7, wherein the second metric comprises one selected from a group of metrics consisting of:
    a change in a rate of the airflow through the chassis; and
    a change in power consumption rate of the cooling system for a given rate of the airflow through the chassis.

9. The method of claim 1, wherein identifying the occurrence of the charged particulates discharge event comprises, by the hardware processor:
    monitoring a duration of time during which the field applicator is active,
    wherein the charged particulates discharge event is predetermined duration of time while the field applicator is active.

10. The method of claim 1, wherein the filtration media has a pore size selected to screen the particulates from entering and interior of the chassis where the hardware components are loaded, and accumulation of the particulates on the filtration media fills at least a portion of pores of the filtration media.

11. A non-transitory machine-readable medium having instructions stored therein, which when executed by a processor of a data processing system, cause the processor to perform operations for managing hardware components positioned in a chassis of the data processing system, the operations comprising:
 identifying an occurrence of a particulate accumulation elimination event, the processor being coupled to a memory of the data processing system, the memory comprising the non-transitory machine-readable medium, and the processor and the memory being ones of the hardware components of the data processing system;
 based on the identifying of the occurrence:
  activating a field applicator to apply an electric field to a filtration media of a filter covering an opening in a chassis of the data processing system to charge at least a portion of particulates accumulated on the filtration media to a charge level to obtain charged particulates, the opening facilitating airflow through the chassis to dissipate heat from the hardware components;
  while the particulates are being charged to the charge level, identifying an occurrence of a charged particulates discharge event;
  based on the occurrence of the charged particulates discharge event:
   grounding at least a frame of the filter to discharge the charged particulates;
   while grounding the at least the frame of the filter, identifying that the particulate accumulation elimination event has ended; and
   deactivating the field applicator and allow the at least the frame to electrically float based on the end of the particulate accumulation elimination event.

12. The non-transitory machine-readable medium of claim 11, wherein identifying the occurrence of the particulate accumulation eliminate event comprises:
 monitoring operation of a cooling system of the data processing system to obtain at least one metric; and
 comparing the metric to a threshold to identify the occurrence of the particulate accumulation elimination event.

13. The non-transitory machine-readable medium of claim 12, wherein the metric comprises one selected from a group of metrics consisting of:
 a rate of the airflow through the chassis; and
 a power consumption rate of the cooling system for a given rate of the airflow through the chassis.

14. The non-transitory machine-readable medium of claim 11, wherein a schedule of when to clear the particulates from the filtration media is maintained by the data processing system, and the occurrence of the particulate accumulation elimination is a point in time defined by the schedule.

15. The non-transitory machine-readable medium of claim 11, wherein the field applicator comprises an electromagnet positioned with the filtration media, and the electric field is oriented through opening which the filtration media covers.

16. A data processing system, comprising:
 hardware components comprising a processor; and
 a memory coupled to the processor to store instructions, which when executed by the processor, cause the processor to perform operations, the operations comprising:
  identifying an occurrence of a particulate accumulation elimination event;
  based on the identifying of the occurrence:
   activating a field applicator to apply an electric field to a filtration media of a filter covering an opening in a chassis of the data processing system to charge at least a portion of particulates accumulated on the filtration media to a charge level to obtain charged particulates, the opening facilitating airflow through the chassis to dissipate heat from the hardware components;
   while the particulates are being charged to the charge level, identifying an occurrence of a charged particulates discharge event;
   based on the occurrence of the charged particulates discharge event:
    grounding at least a frame of the filter to discharge the charged particulates;
    while grounding the at least the frame of the filter, identifying that the particulate accumulation elimination event has ended; and
    deactivating the field applicator and allow the at least the frame to electrically float based on the end of the particulate accumulation elimination event.

17. The data processing system of claim 16, wherein identifying the occurrence of the particulate accumulation eliminate event comprises:
 monitoring operation of a cooling system of the data processing system to obtain at least one metric; and
 comparing the metric to a threshold to identify the occurrence of the particulate accumulation elimination event.

18. The data processing system of claim 17, wherein the metric comprises one selected from a group of metrics consisting of:
 a rate of the airflow through the chassis; and
 a power consumption rate of the cooling system for a given rate of the airflow through the chassis.

19. The data processing system of claim 16, wherein a schedule of when to clear the particulates from the filtration media is maintained by the data processing system, and the occurrence of the particulate accumulation elimination is a point in time defined by the schedule.

20. The data processing system of claim 16, wherein the field applicator comprises an electromagnet positioned with the filtration media, and the electric field is oriented through opening which the filtration media covers.

* * * * *